(12) United States Patent
Tamura et al.

(10) Patent No.: US 8,786,015 B2
(45) Date of Patent: Jul. 22, 2014

(54) SUPER-JUNCTION SEMICONDUCTOR DEVICE

(75) Inventors: Takahiro Tamura, Matsumoto (JP); Yasuhiko Onishi, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 13/369,413

(22) Filed: Feb. 9, 2012

(65) Prior Publication Data
US 2012/0211833 A1    Aug. 23, 2012

(30) Foreign Application Priority Data

Feb. 17, 2011    (JP) .................................. 2011-031836

(51) Int. Cl.
*H01L 29/66* (2006.01)
*H01L 21/8238* (2006.01)

(52) U.S. Cl.
USPC .......................................... 257/339; 438/220

(58) Field of Classification Search
USPC .................. 257/296, 328, 339, 487
See application file for complete search history.

(56) References Cited

U.S. PATENT DOCUMENTS

| | | | | |
|---|---|---|---|---|
| 5,559,355 A * | 9/1996 | Yamazaki et al. | ............. | 257/341 |
| 6,512,268 B1 * | 1/2003 | Ueno | ............................ | 257/341 |
| 2005/0017292 A1 * | 1/2005 | Onishi et al. | .................. | 257/328 |
| 2005/0145933 A1 * | 7/2005 | Onishi et al. | .................. | 257/328 |
| 2006/0033153 A1 * | 2/2006 | Onishi et al. | .................. | 257/328 |
| 2006/0043480 A1 * | 3/2006 | Tsuchitani et al. | ........... | 257/341 |
| 2006/0289915 A1 * | 12/2006 | Omura et al. | ................. | 257/296 |
| 2009/0159963 A1 * | 6/2009 | Yamaguchi et al. | .......... | 257/328 |
| 2012/0211833 A1 * | 8/2012 | Tamura et al. | ................ | 257/339 |

FOREIGN PATENT DOCUMENTS

| | | |
|---|---|---|
| JP | 2006-351985 A | 12/2006 |
| JP | 2009-152506 A | 7/2009 |

* cited by examiner

*Primary Examiner* — Julio J Maldonado
*Assistant Examiner* — Moin Rahman
(74) *Attorney, Agent, or Firm* — Rossi, Kimms & McDowell LLP

(57) ABSTRACT

A super-junction semiconductor device includes a drift layer including an alternating-conductivity-type layer that includes n-type region and p-type region arranged alternately in parallel to the first major surface of an n-type substrate. These alternating regions extend deep in a direction perpendicular to the first major surface. The first major surface includes a main device region with a gate electrode and a main source electrode and sensing device region with a gate electrode and a sensing source electrode. There is a common drain electrode on the second major surface of the substrate. There is a separation region between the main device region and the sensing device region. It includes an n-type region and p-type regions in the n-type region. The p-type regions are in an electrically floating state in the directions parallel and perpendicular to the first alternating-conductivity-type layer.

8 Claims, 10 Drawing Sheets

SUPER-JUNCTION SEMICONDUCTOR DEVICE

BACKGROUND OF THE INVENTION

A. Field of the Invention

The present invention relates to super-junction semiconductor devices exhibiting a high breakdown voltage and a high current capacity and applicable to insulated-gate field-effect transistors (hereinafter referred to as "MOSFET's"), insulated-gate bipolar transistors (hereinafter referred to as "IGBT's"), and bipolar transistors.

B. Description of the Related Art

Vertical power semiconductor devices, which include a drift layer including an alternating-conductivity-type layer that includes a heavily-doped n-type region and a heavily-doped p-type region arranged alternately and adjoining to each other in parallel to the major surface of the semiconductor device (hereinafter referred to simply as the "major surface"), are well known to the persons skilled in the art. The heavily-doped n-type regions and heavily-doped p-type regions are shaped to be long in perpendicular to the major surface and to be narrow in parallel to the major surface. Hereinafter, the semiconductor devices which include a drift layer including the alternating-conductivity-type layer as described above will be referred to as the "super-junction semiconductor devices". In the super-junction semiconductor devices, pn-junctions extend in parallel to each other and in perpendicular to the major surface. In the OFF-state of the device, depletion layers expand from the pn-junctions to the n- and p-type regions on both sides thereof in parallel to the major surface, depleting the entire drift layer quickly. Therefore, the super-junction semiconductor devices facilitate obtaining a high breakdown voltage and low ON-state resistance simultaneously.

Power semiconductor devices may break down if an overcurrent is caused by a short-circuit in the power semiconductor devices. A method which provides the power semiconductor device with a current detecting section for detecting an overcurrent signal and controls the power semiconductor device gate based on the overcurrent signal to further control the current flowing through the power semiconductor device is employed widely to prevent the power semiconductor devices from breaking down. In the above-described general method for preventing the power semiconductor device from breakdown, a current detecting resistor is connected in series to a separate subsidiary device connected in parallel to a main device and a potential difference caused by an overcurrent across the current detecting resistor is detected.

The following Japanese Unexamined Patent Application Publication No. 2006-351985 discloses the application of the current detection method described above to a super-junction semiconductor device. As disclosed in JP 2006-351985, a current detecting cell region (sensing device region 8) which works as a current detecting section is formed in the chip, in which main device region 7 is formed, as shown in FIG. 3, to integrate sensing device region 8 and main device region 7 into a unit and further to simplify the parts and to reduce the size of the parts. In FIG. 3, separation region 9, n-type region 1 in main device region 7, p-type region 2 in main device region 7, n-type region 3 in separation region 9, p-type region 4 in separation region 9, n-type region 5 in sensing device region 8, and p-type region 6 in sensing device region 8 are shown.

The following Japanese Unexamined Patent Application Publication No. 2009-152506 discloses a semiconductor apparatus that facilitates detecting the current flowing through a main cell with a high accuracy. The semiconductor apparatus disclosed in JP 2009-152506 is formed as an assembly of a plurality of insulated-gate transistor cells formed on a semiconductor substrate. The respective gate terminals of a main cell and a sensing cell are connected in common. The respective source terminals of the main and sensing cells are connected in common. The drain of the sensing cell is connected commonly to the drain of the main via a current detecting resistor.

If alternating-conductivity-type-layer 100 that constitutes a drift layer is formed continuously of a planar stripe pattern common to the main and sensing device regions, as described in Japanese Unexamined Patent Application Publication No. 2006-351985 and as shown in FIG. 3, the current detection accuracy will be lowered, since the main and sensing device regions are connected electrically via the p-type region 2 internal resistance and since current leakage between the main and sensing device regions is inevitable. Therefore, it is necessary to separate main device region 7 and sensing device region 8 from each other electrically. If p-type region 2 is cut off between main device region 7 and sensing device region 8, alternating-conductivity-type layer 100 will be discontinuous between main device region 7 and sensing device region 8, lowering the breakdown voltage.

In view of the foregoing, it would be desirable to obviate the problems described above. It would be also desirable to provide a super-junction semiconductor device which prevents the breakdown voltage from lowering, even if the main device region and the sensing device region for current detection are separated from each other electrically.

The present invention is directed to overcoming or at least reducing the effects of one or more of the problems set forth above. It provides a super-junction semiconductor device with a sensing device region for current detection and facilitates preventing the breakdown voltage from lowering, even if the main device region and the sensing device region are separated electrically from the each other.

SUMMARY OF THE INVENTION

According to the subject matter of the appended claim 1, there is provided a super-junction semiconductor device including:

a semiconductor substrate of a first conductivity type;

a drift layer on the semiconductor substrate, the drift layer including a first alternating-conductivity-type layer including a first semiconductor region of the first conductivity type and a second semiconductor region of a second conductivity type, both long in perpendicular to the first major surface of the semiconductor substrate and short in width, the first semiconductor region and the second semiconductor region being arranged alternately in parallel to the first major surface of the semiconductor substrate, the first semiconductor region and the second semiconductor region adjoining to each other in parallel to the first major surface of the semiconductor substrate;

a main device region on the first major surface of the semiconductor substrate, the main device region including a main device cell including a main gate electrode and a main source electrode;

a sensing device region on the first major surface of the semiconductor substrate, the sensing device region including a sensing device cell including a sensing gate electrode and a sensing source electrode;

a common drain electrode on the second major surface of the semiconductor substrate;

a separation region on the first major surface of the semiconductor substrate, the separation region being between the main device region and the sensing device region; and the separation region including a third semiconductor region of the first conductivity type and a fourth semiconductor region of the second conductivity type, the fourth semiconductor regions being arranged in the third semiconductor region in an electrically floating state in parallel and perpendicular to the first alternating-conductivity-type layer.

According to the subject matter of the appended claim 2, the first alternating-conductivity-type layer in the main device region and the sensing device region is shaped with a planar stripe pattern.

According to the subject matter of the appended claim 3, the separation region includes a second alternating-conductivity-type layer, in which the fourth semiconductor regions are arranged in the third semiconductor region in a planer lattice pattern.

According to the subject matter of the appended claim 4, the repeating pitch of the second alternating-conductivity-type layer is narrower than the repeating pitch of the first alternating-conductivity type layer.

According to the subject matter of the appended claim 5, the sensing device region is surrounded by the main device region with the separation region interposed between the sensing device region and the main device region.

According to the subject matter of the appended claim 6, the super-junction semiconductor device further includes an oxide film on the separation region, and a gate oxide film under the gate electrode, and the oxide film on the separation region is thicker than the gate oxide film.

According to the subject matter of the appended claim 7, the thickness of the third and fourth semiconductor regions in the direction perpendicular to the first major surface of the semiconductor substrate is larger than the thickness of the first alternating-conductivity-type layer in the direction perpendicular to the first major surface of the semiconductor substrate.

According to the invention, a super-junction semiconductor device, which includes a sensing device region for current detection and facilitates preventing the breakdown voltage from lowering, even if the main device region and the sensing device region are separated electrically from the each other, is obtained.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Now the invention will be described in detail hereinafter with reference to the accompanied drawings which illustrate the preferred embodiments of the invention. Although the invention is described in connection with the preferred embodiments thereof, changes and modifications are obvious to the persons skilled in the art without departing from the true spirit of the invention. Therefore, the invention is to be understood not by the specific descriptions herein, but by the appended claims.

First Embodiment

Many conventional methods employed for preventing a super-junction semiconductor device from breaking down as a result of an overcurrent detect the overcurrent flowing through the super-junction semiconductor device. When the detected overcurrent is high enough to breakdown the super-junction semiconductor device, the conventional methods feedback the detected overcurrent to the gate signal of the main device to control the current flowing through the main device and to prevent the main device from breaking down.

Figure 8:
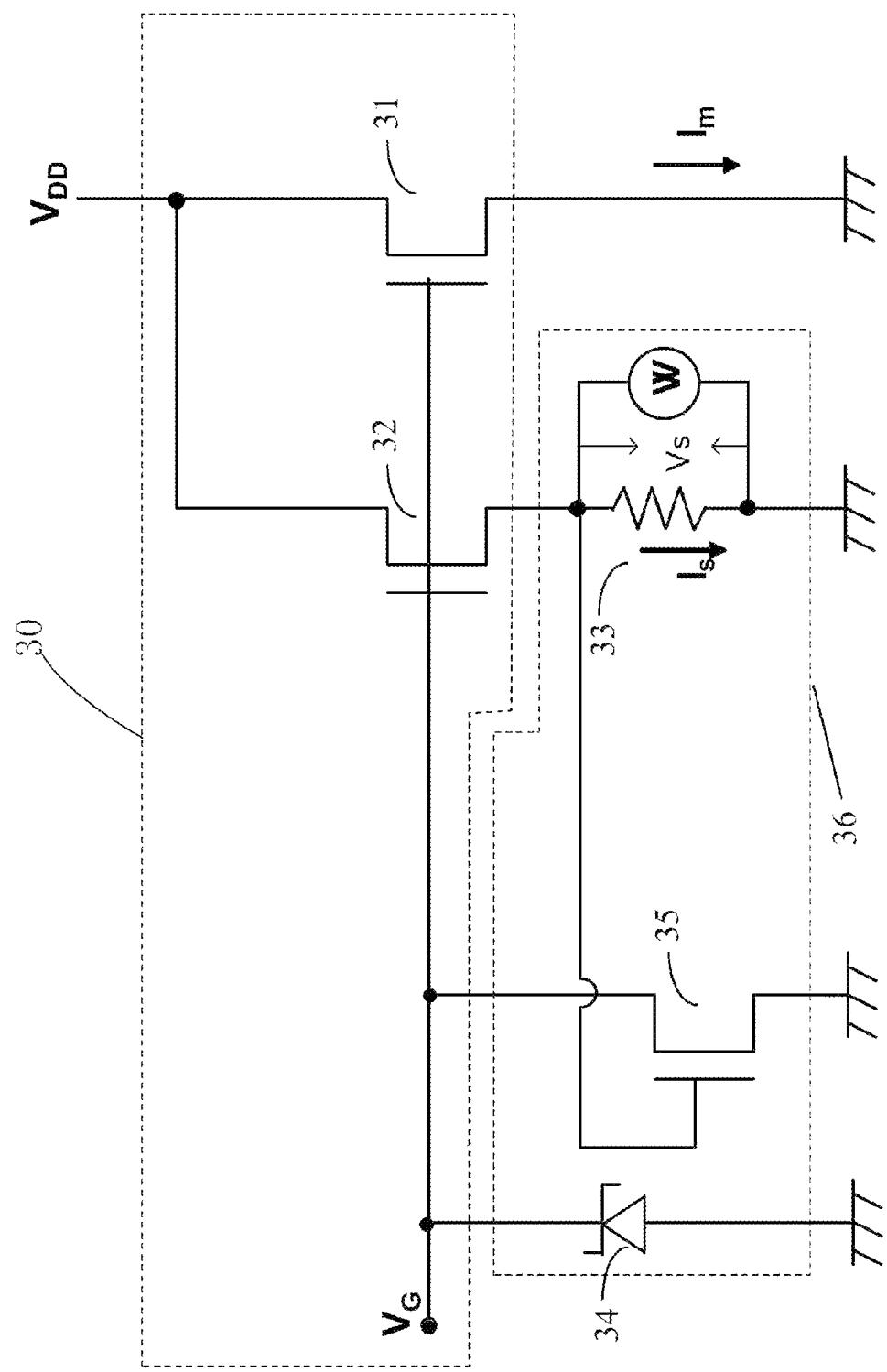
FIG. 8 is the equivalent circuit diagram of an overcurrent protecting circuit connected to any of the super-junction semiconductor devices according to the invention for detecting an overcurrent and for preventing the super-junction semiconductor device from being broken down by the overcurrent.

FIG. 8 is an equivalent circuit diagram, in which overcurrent protecting circuit 36 is connected to super-junction semiconductor device 30 according to the invention including main device 31 and sensing device 32.

In the equivalent circuit shown in FIG. 8, the voltage $V_S$ detected, when an overcurrent flows from the super-junction semiconductor device 30 drain, as the potential difference across overcurrent detecting resistor 33 connected to the source side of sensing device 32, works as the gate input voltage Vs of gate voltage control device 35. When the gate input voltage Vs caused by the overcurrent detection and fed to gate voltage control device 35 is higher than the threshold voltage thereof, gate voltage control device 35 becomes conductive.

As a result, the gate voltage $V_G$ fed to main device 31 is short-circuited and lowered due to the conduction of gate voltage control device 35 and the current flowing through main device 31 is reduced. Therefore, super-junction semiconductor device 30 is prevented from breaking down as a result of an overcurrent. In FIG. 8, Zener diode 34 for overcurrent protection between the gate and source is shown. The gate voltage $V_G$ is connected and fed commonly to main device 31 and sensing device 32 in FIG. 8. Alternatively, main device 31 and sensing device 32 may be separated and independent. In the alternative case, the voltage $V_G$ in FIG. 8 is connected and fed to the main device 31 gate.

Figure 1A:
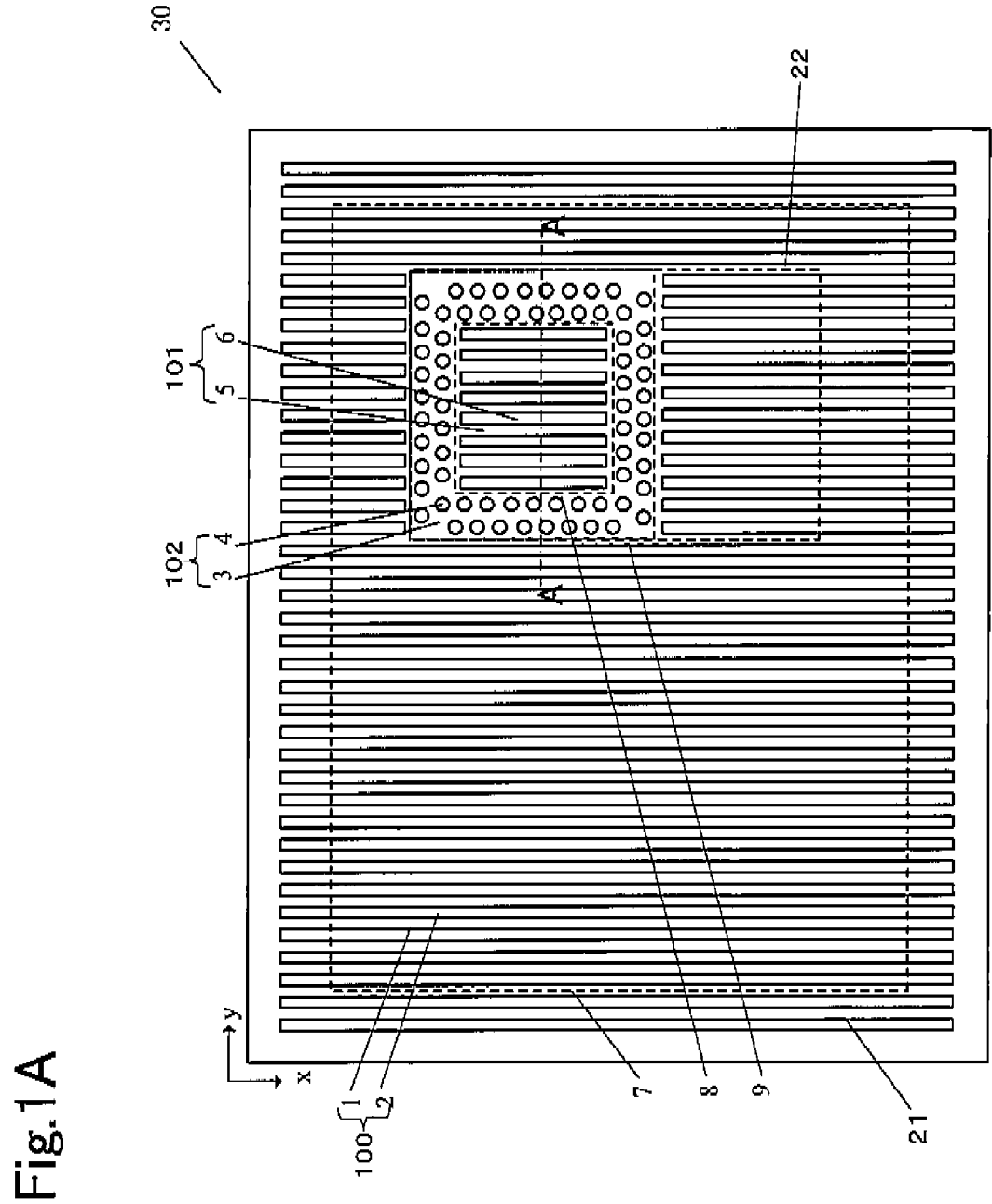
FIG. 1A is a top plan view showing the planar patterns of the alternating-conductivity-type layers in a super-junction MOSFET according to a first embodiment of the invention and FIG. 1B is the cross-sectional view along the broken line A-A in FIG. 1A.
Figure 1B:
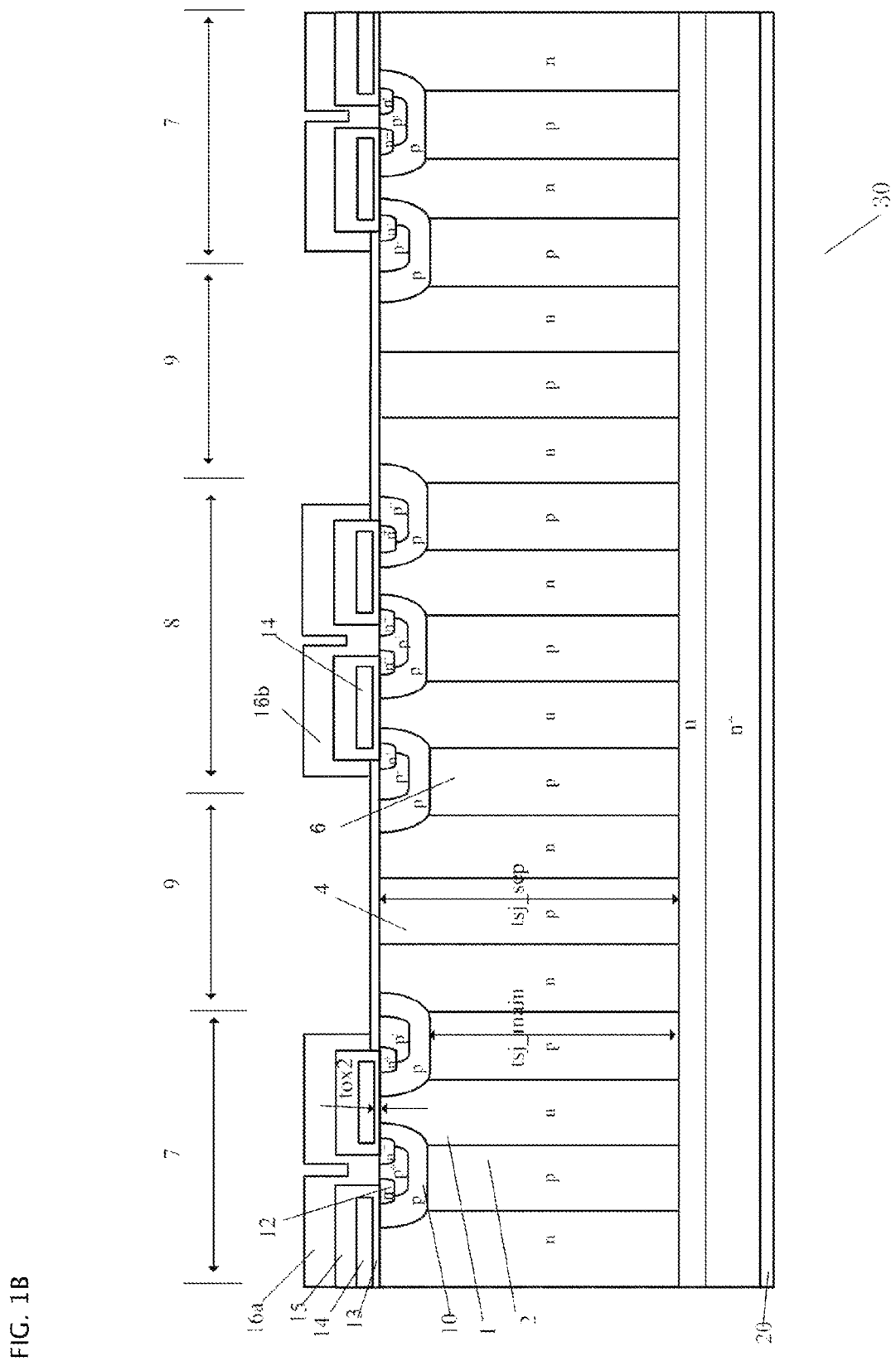

FIG. 1A is a top plan view showing the planar patterns of the alternating-conductivity-type layers in a super-junction MOSFET according to a first embodiment of the invention. FIG. 1B is the cross sectional view along the broken line A-A in FIG. 1A.

For ease of understanding, the insulator films and the metal electrode films usually formed on the semiconductor chip surface of a vertical super-junction MOSFET are omitted to show the planar patterns of alternating-conductivity-type layers 100, 101, and 102 on the semiconductor substrate. In main device region 7 and sensing device region 8, both shown by the broken lines in FIG. 1A, alternating-conductivity-type layers 100 and 101 have a planar stripe pattern.

The p-type region 2 in alternating-conductivity-type layer 100 and p-type region 6 in alternating-conductivity-type layer 101 are not continuous to each other but are separated from each other in the vicinity of sensing device region 8 by separation region 9 which separates main device 7 and sensing device region 8 from each other. Sensing device region 8 is surrounded by separation region 9 on all sides. In separation region 9, p-type regions 4 are arranged in n-type region 3 in a planar lattice pattern. Main device region 7 corresponds to main device 31 of super-junction semiconductor device 30 in FIG. 8 and sensing device region 8 to sensing device 32 therein, respectively.

Although not shown in FIG. 1A, gate electrode 14 and drain electrode 20 are used commonly by main device region 7 and sensing device region 8. Gate electrode 14 is a unitary electrode film, to which cells are electrically connected individually. Drain electrode 20 is a unitary electrode film, to which the cells are electrically connected individually. Source electrode 16a of main device region 7 and sensing source electrode 16b of sensing device region 8 are formed individually as electrode films on the respective region surfaces and separated electrically from each other. The source electrodes are disposed individually on the respective regions to separate the current paths and an overcurrent is detected by detecting the potential difference across resistor 33 connected externally to the sensing source side.

Figure 3A:
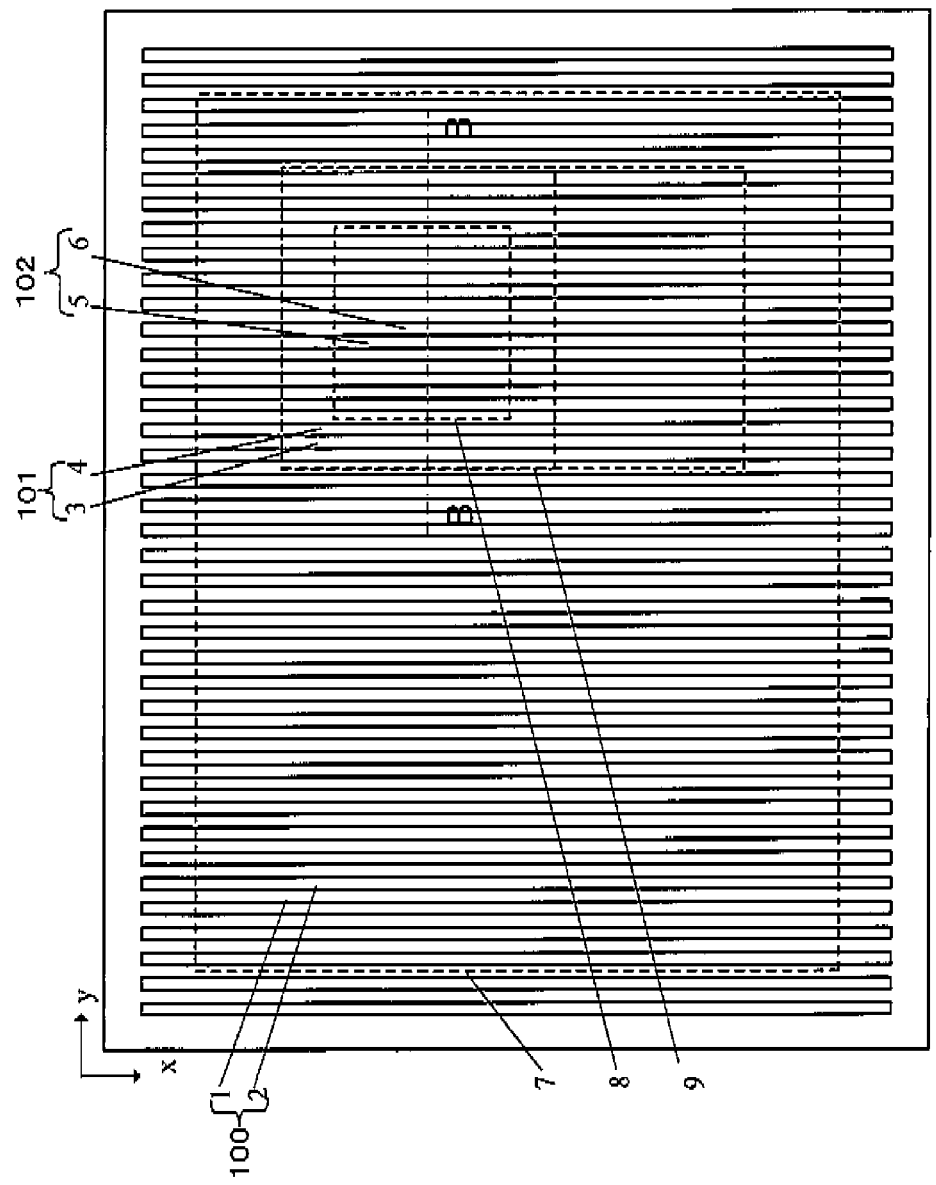
FIG. 3A is a top plan view showing the planar pattern of the alternating-conductivity-type layer in a conventional super-junction MOSFET and FIG. 3B is the cross sectional view along the broken line B-B in FIG. 3A.
Figure 3B:
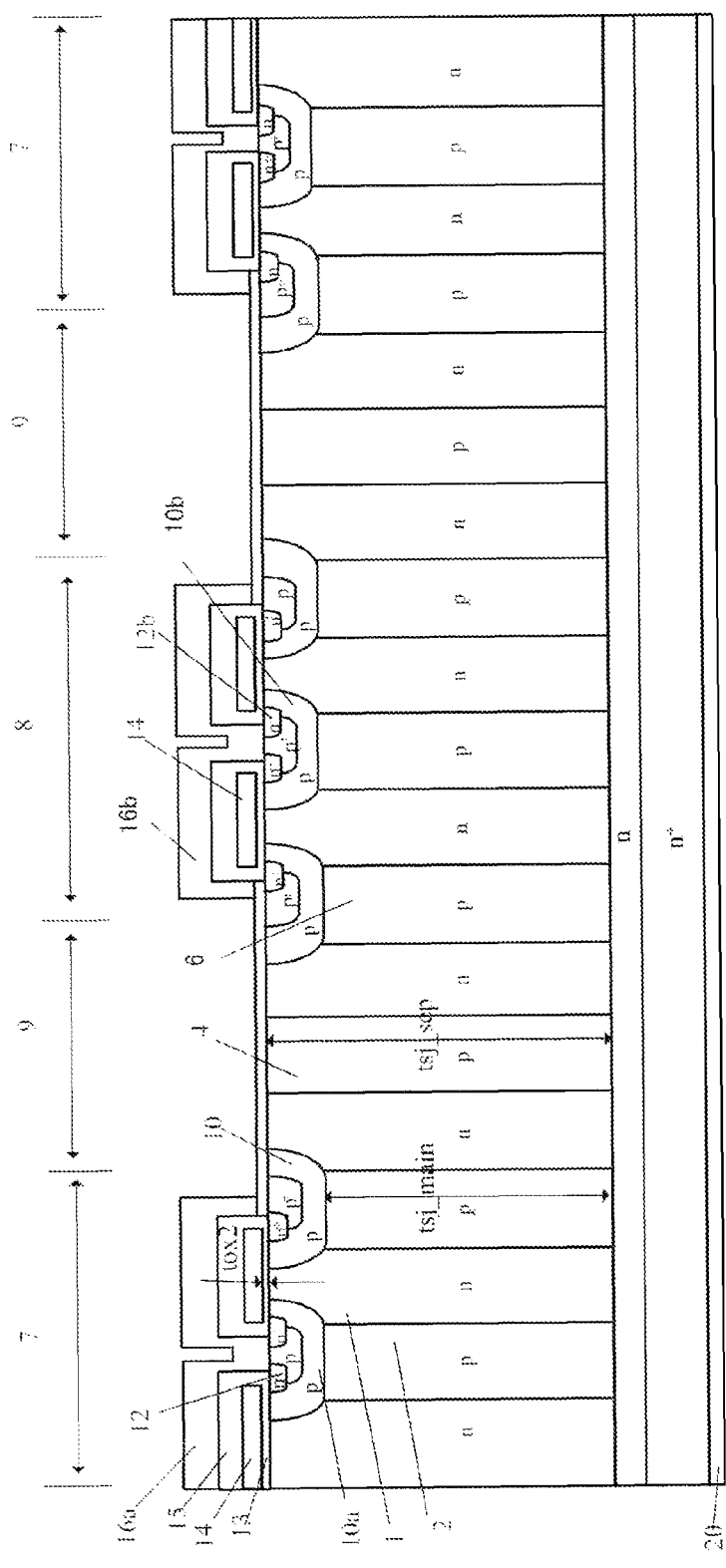

Now the conventional structure, in which p-type regions 2 and 6 in main and sensing device regions 7 and 8 are not separated from each other, will be described below with reference to FIGS. 3A and 3B. FIG. 3A is a top plan view showing the planar pattern of the alternating-conductivity-type layer in a conventional super-junction MOSFET. FIG. 3B is the cross sectional view along the broken line B-B in FIG. 3A.

As shown in FIG. 3A, n-type region 1 and p-type region 2 are separated electrically from each other in the drift layer in the y-direction in FIG. 3A perpendicular to the extending direction of the planar stripe pattern (the x-direction in the drawing). Therefore, if any n-type source region 12 is not formed in p-type base region 10 in separation region 9 as shown in FIG. 3B, main device region 7 and sensing device region 8 will be separated easily from each other in the y-direction in FIG. 3A perpendicular to the extending direction of the planar stripe pattern.

However, p-type regions 2, 4, and 6 are continuous to each other between main device region 7 and separation region 9 and between separation region 9 and sensing device region 8 in the extending direction of the planar stripe pattern (the x-direction in FIG. 3A) as shown in FIGS. 3A and 3B. Therefore, it is hard to completely separate main device region 7 and sensing device region 8 electrically from each other in the extending direction of the planar stripe pattern (the x-direction in FIG. 3A). In other words, p-type base region 10a in main device region 7 and sensing p-type base region 10b in sensing device region 8 are connected electrically to each other via the internal resistance caused along the current paths in p-type regions 2, 4, and 6.

If the internal resistance is employed for an overcurrent detecting resistor as described in Japanese Unexamined Patent Application Publication No. 2006-351985, a problem will be caused sometimes in detecting an overcurrent with a higher accuracy. If p-type regions 2, 4, and 6 are separated from each other and only p-type region 4 in separation region 9 is removed simply for avoiding the problem caused in obtaining higher overcurrent detection accuracy, depletion layers will hardly expand between main device 7 and sensing device 8, and the breakdown voltage will be lowered.

In order to obviate the problems described above, p-type regions 4 are not arranged in a planar stripe pattern, but rather in a planar lattice pattern in separation region 9 between main device region 7 and sensing device region 8 as shown in FIG. 1A. By the p-type region 4 arrangement in a planar lattice pattern, p-type regions 2 and 6 are separated from each other in the directions parallel and perpendicular to the extending direction of the stripes in the alternating-conductivity-type layer. Therefore, it becomes possible to electrically separate main device region 7 and sensing device region 8 from each other. Further, the p-type region between main device region 7 and sensing device region 8 is not cut off completely. The p-type regions 4 arranged in a planar lattice pattern facilitate expanding the depletion layers in the boundary between main device region 7 and separation region 9 and in the boundary between sensing device region 8 and separation region 9 and maintaining the breakdown voltage so as not to cause the lowering thereof.

Moreover, it is possible to set the thickness tsj-sep of the alternating-conductivity-type layer in separation region 9 in perpendicular to a major surface of the semiconductor substrate to be larger than the thickness tsj-main of the alternating-conductivity-type layer in perpendicular to the substrate major surface in main device region 7 or sensing device region 8. Therefore, the breakdown voltage in separation region 9 is prevented from being lowered due to the thickened alternating conductivity type layer therein.

On the peripheral side of main device region 7, breakdown withstanding section 21 is formed. In the region surrounded by broken lines 22, a gate electrode pad is disposed.

According the first embodiment described above, the overcurrent protecting circuit connected to the source electrode in the sensing device region facilitates protecting the super-junction semiconductor device from an overcurrent without lowering the breakdown voltage.

Second Embodiment

Figure 2:
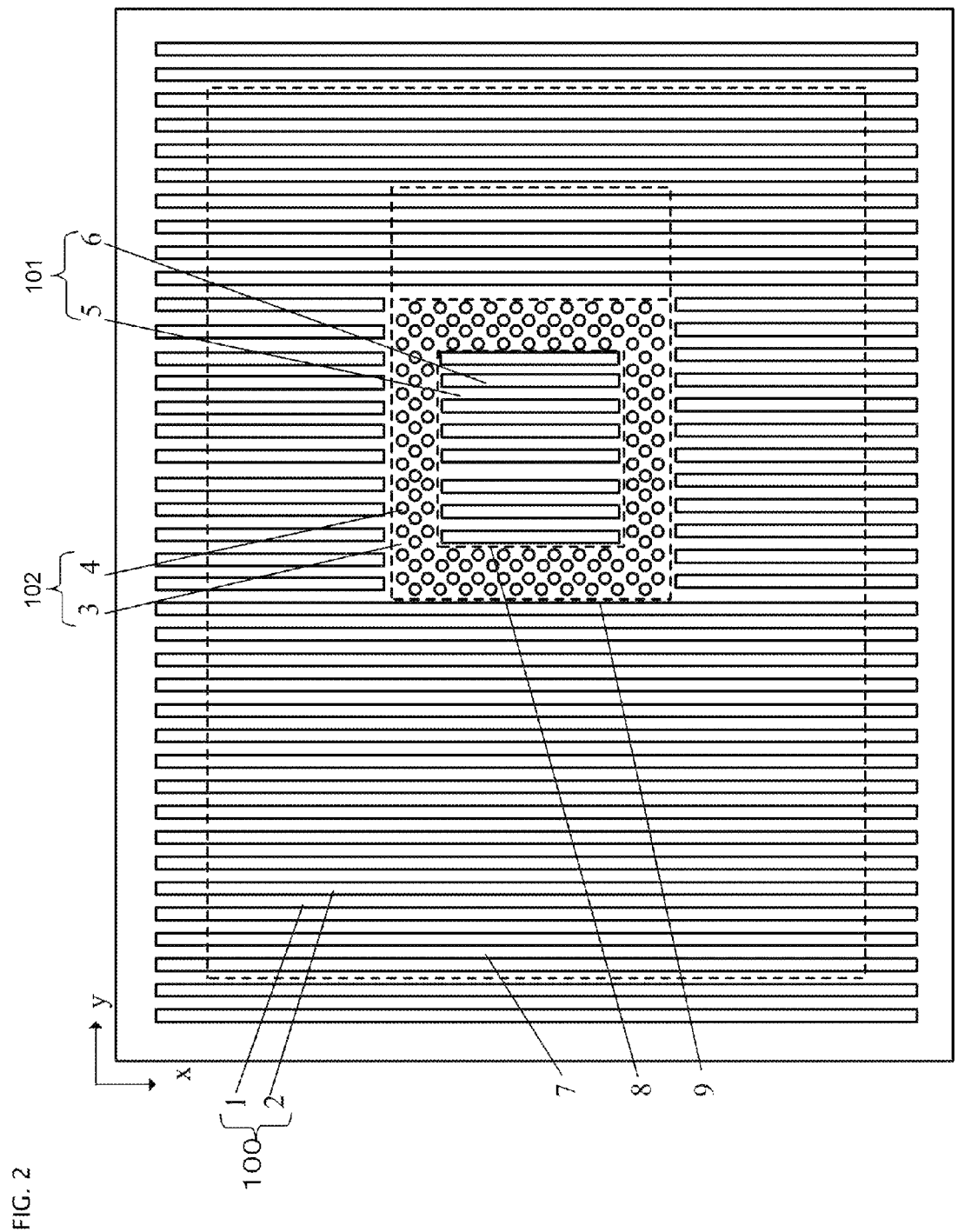
FIG. 2 is a top plan view showing the planar patterns of the alternating-conductivity-type layers in a super-junction MOSFET according to a second embodiment of the invention.

FIG. 2 is a top plan view showing the planar patterns of the alternating-conductivity-type layers in a super-junction MOSFET according to a second embodiment of the invention.

The super-junction MOSFET according to the second embodiment is a modification of the super-junction MOSFET according to the first embodiment. The super-junction MOSFET according to the second embodiment is different from the super-junction MOSFET according to the first embodiment in that the pitch of the planar lattice pattern in alternating-conductivity type layer 102 is set to be narrower than the pitch of the planar stripe pattern in alternating-conductivity type layers 100 and 101. Since the narrower pitch setting in alternating-conductivity-type layer 102 according to the second embodiment makes the depletion layers expand more easily and relaxes the electric field more easily, it is possible to obtain a higher breakdown voltage.

Third Embodiment

Figure 4:
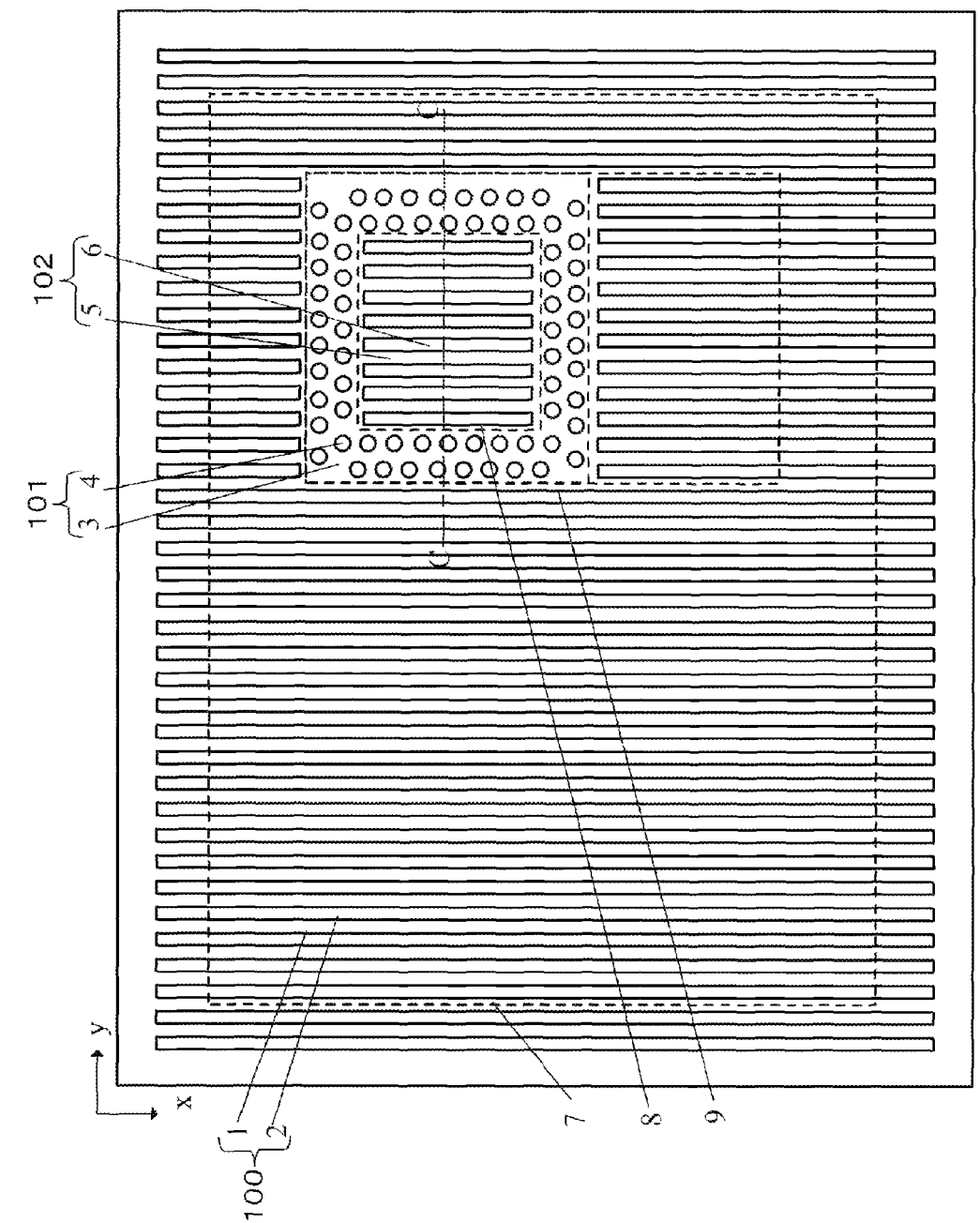
FIG. 4 is a top plan view showing the planar patterns of the alternating-conductivity-type layers in a super-junction MOSFET according to a third embodiment of the invention.
Figure 5:
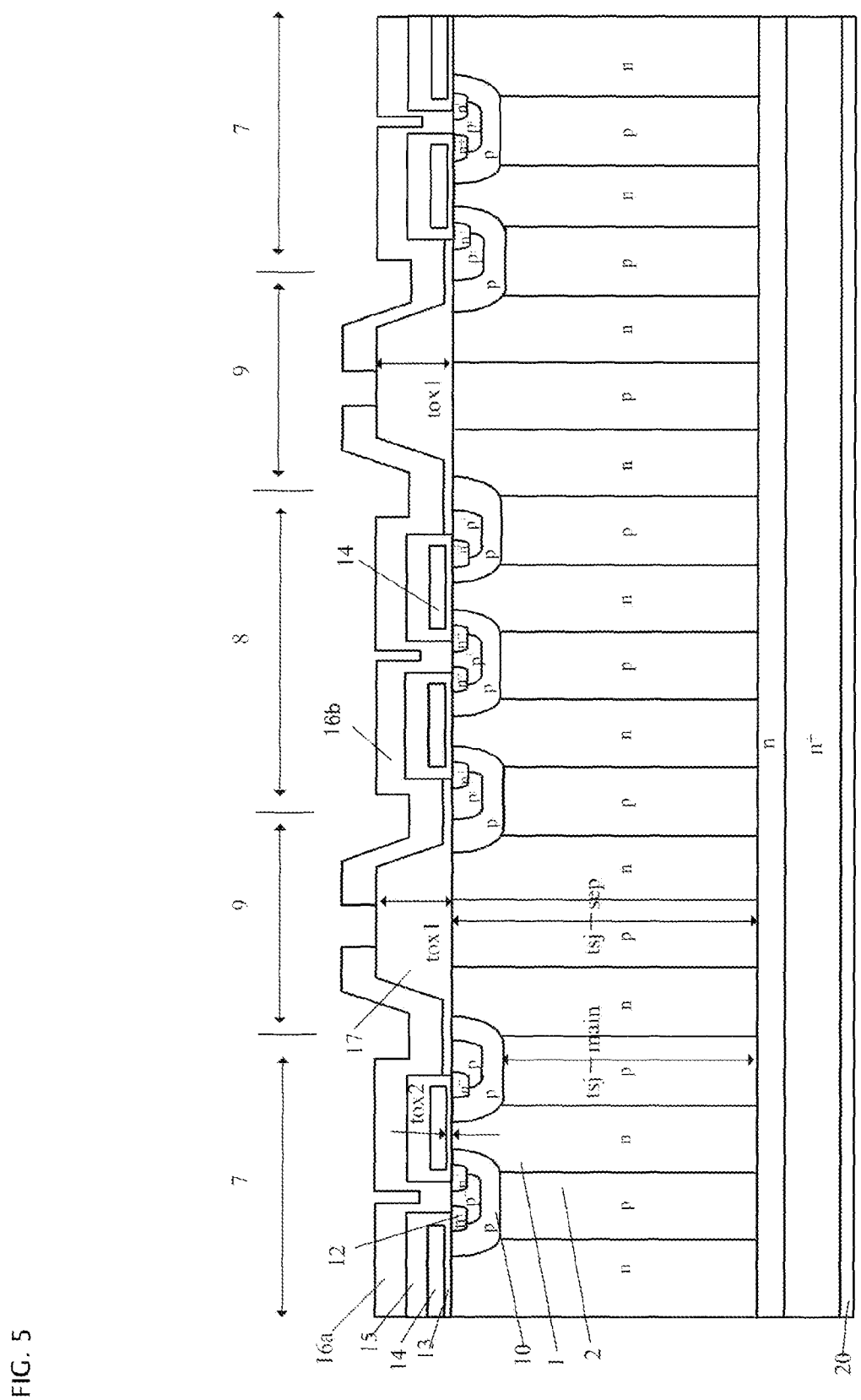
FIG. 5 is the cross sectional view along the broken line C-C in FIG. 4.

FIG. 4 is a top plan view showing the planar patterns of the alternating-conductivity-type layers in a super-junction MOSFET according to a third embodiment of the invention. FIG. 5 is the cross sectional view along the broken line C-C in FIG. 4.

For ease of understanding, the insulator films and the metal electrode films usually formed on the semiconductor chip surface of a vertical super-junction MOSFET are omitted in FIG. 4 to show the planar patterns of alternating-conductivity-type layers 100, 101, and 102 on the semiconductor substrate.

In the same manner as described in FIG. 1A, the alternating-conductivity type layers in main device region 7 and sensing device regions 8 employ a planar stripe pattern. Separation region 9 between main device region 7 and sensing device region 8 separates p-type regions 2 and 6 from each other. Sensing device region 8 is surrounded by separation region 9 on all sides. In separation region 9, p-type regions 4 are arranged in n-type region 3 in a planar lattice pattern.

The structure shown in FIG. 4 is the same as the structure shown in FIG. 1A. As shown in FIG. 5, gate electrode 14 and drain electrode 20 are used commonly by main device region 7 and sensing device region 8 according to the third embodiment. Source electrode 16a of main device region 7 and sensing source electrode 16b of sensing device region 8 are formed individually as unitary electrode films on the respective region surfaces. To the unitary electrode films, a plurality of cells is electrically connected individually. Source electrodes 16a and 16b are disposed individually on the respective regions to cut off the current path and an overcurrent is detected by detecting the potential difference across external resistor 33 (shown in FIG. 8) connected to the source side of sensing device region 8.

If the oxide films on main device region 7, sensing device region 8, and separation region 9 are the same in thickness, the breakdown voltage will be prone to lowering in separation region 9. Separation region 9 includes an alternating-conductivity-type layer having a planar lattice pattern different from the planar stripe pattern of the alternating-conductivity-type layers in main device region 7 and sensing device region 8. Between separation region 9 and main device region 7 or sensing device region 8, the alternating-conductivity-type player shifts from a lattice-shaped one to a stripe-shaped one. Therefore, the charge balance indispensable to prevent the breakdown voltage from lowering is liable to be unstable in the boundary between separation region 9 and main device region 7 or sensing device region 8. For manufacturing a super-junction semiconductor device that does not cause any breakdown voltage lowering in separation region 9, it is necessary to design the device strictly and to control the manufacturing process exactly.

According to the third embodiment of the invention, the oxide film thickness tox1 on separation region 9 is set to be thicker than the gate oxide film thickness tox2 on the other regions as shown in FIG. 5. The oxide film set to be thicker facilitates relaxing the electric field in the alternating-conductivity-type layer thereunder. Therefore, even when the charge balance in separation region 9 becomes unstable as described above, the lowered breakdown voltage is shared by the oxide film due to the field plate effect and the breakdown voltage in separation region 9 is prevented from lowering.

By thickening the oxide film on separation region 9, it becomes impossible to form a p-type base region and an n-type source region in the surface potion of separation region 9. However, since separation region 9 does not contribute to the current between the drain and the source, the p-type base region and the n-type source region are unnecessary essentially. Therefore, no problem results. Since it is possible to set the thickness tsj-sep of the alternating-conductivity-type layer in separation region 9 in perpendicular to a semiconductor substrate major surface to be thicker than the thickness tsj-main of the alternating-conductivity-type layer in the other regions, the breakdown voltage in separation region 9 is prevented from lowering due to the thickened alternating-conductivity-type layer therein.

As described above, by forming an oxide film, the thickness tox1 thereof is larger than the gate oxide film thickness tox2, on separation region 9, an electrically separated sensing device region for current detection is built in a semiconductor device without lowering the breakdown voltage in separation region 9.

Fourth Embodiment

Figure 6:
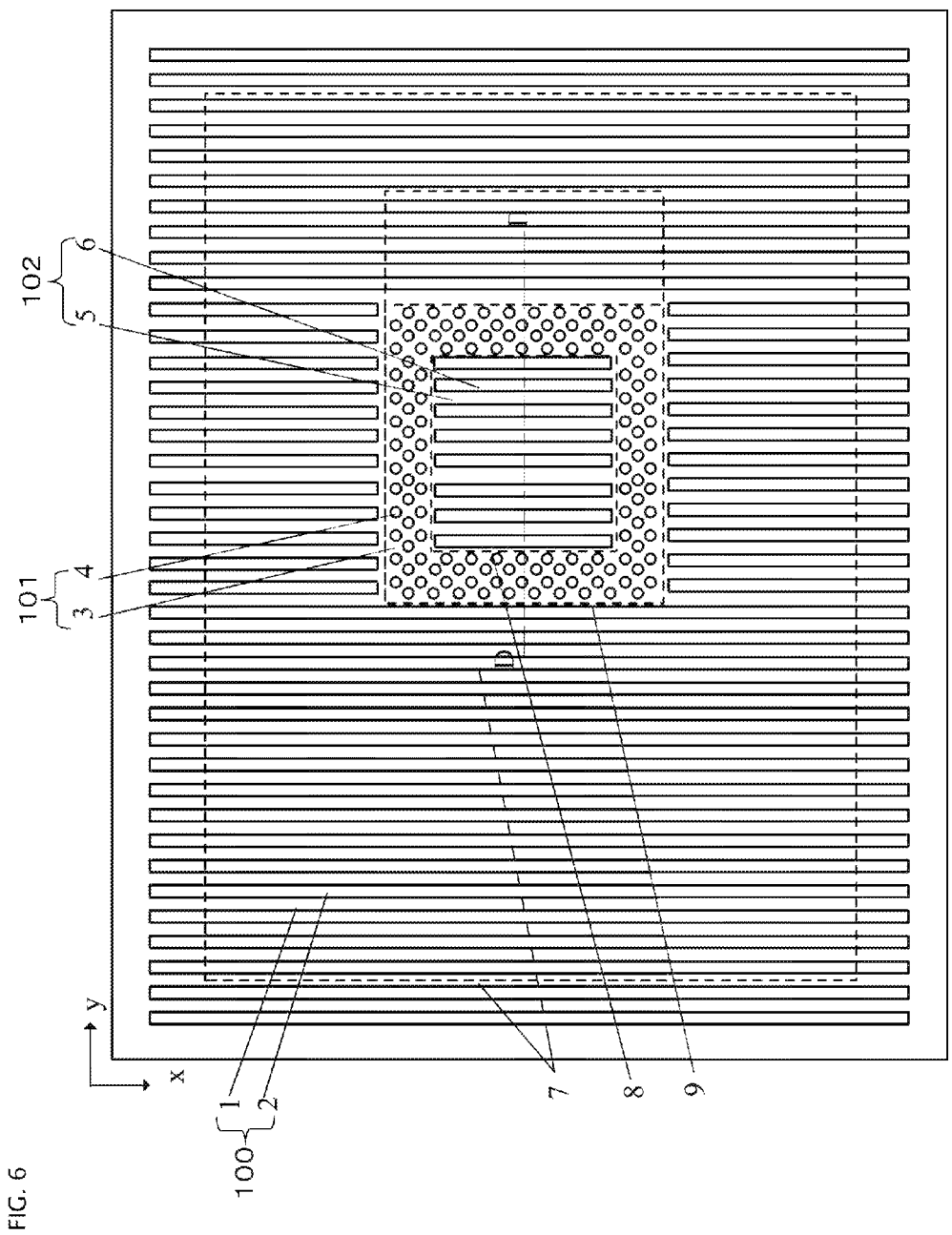
FIG. 6 is a top plan view showing the planar patterns of the alternating-conductivity-type layers in a super-junction MOSFET according to a fourth embodiment of the invention.
Figure 7:
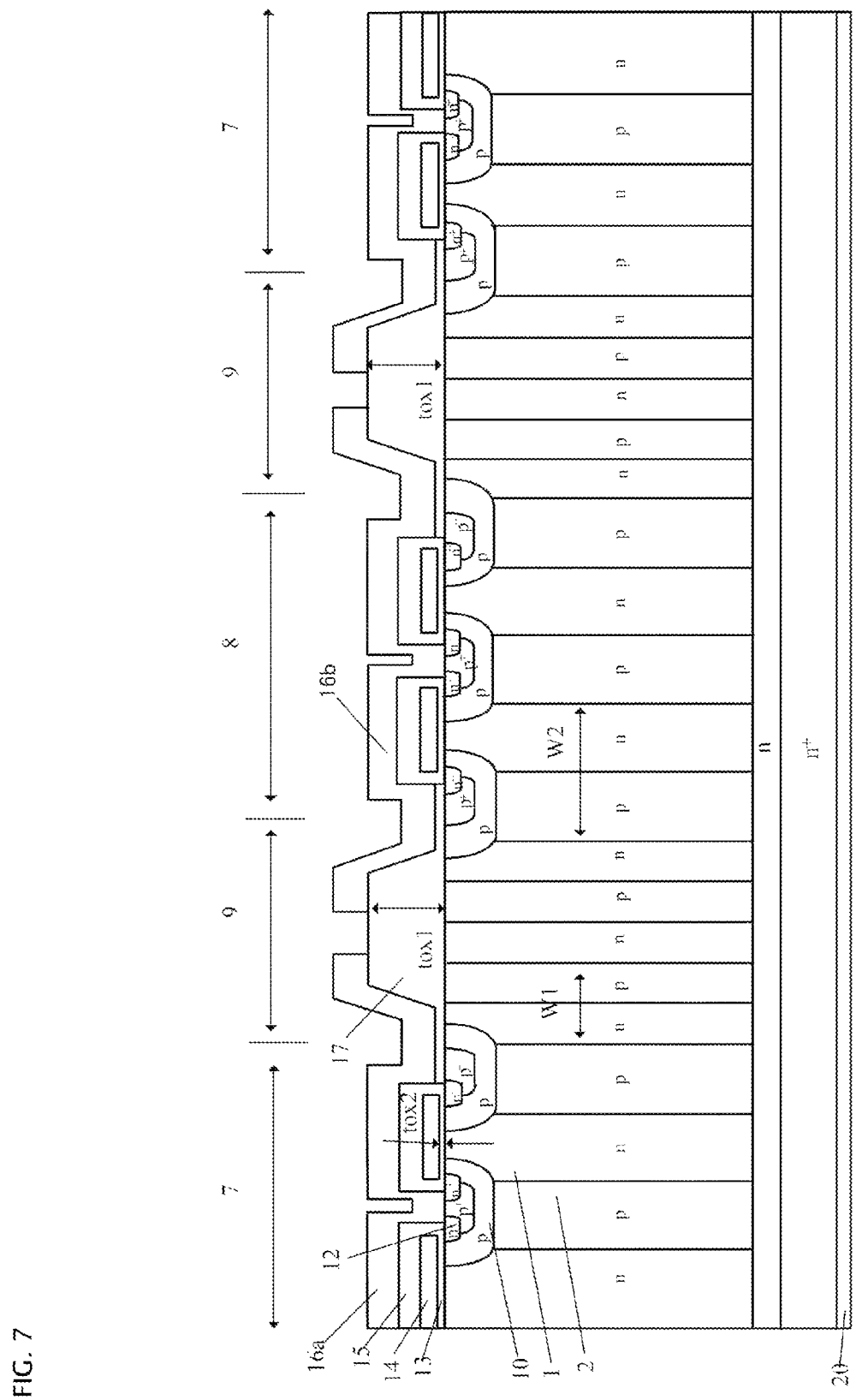
FIG. 7 is the cross sectional view along the broken line D-D in FIG. 6.

FIG. 6 is a top plan view showing the planar patterns of the alternating-conductivity-type layers in a super-junction MOSFET according to a fourth embodiment of the invention. FIG. 7 is the cross sectional view along the broken line D-D in FIG. 6.

The super-junction MOSFET according to the fourth embodiment is a modification of the super-junction MOSFET according to the third embodiment. The super-junction MOSFET according to the fourth embodiment is different from the super-junction MOSFET according to the third embodiment in that the repeating pitch W1 in alternating-conductivity-type layer 101 in separation region 9 is set to be narrower than the repeating pitch W2 in alternating-conductivity-type layers 100 and 102 in main device region 7 and sensing device region 8. The super-junction MOSFET according to the fourth embodiment, which narrows the pitch in alternating-conductivity-type layer 101 in separation region 9, facilitates expanding the depletion layer and relaxing the electric field in separation region 9.

In combination with thickening the oxide film on separation region 9, the super-junction MOSFET according to the fourth embodiment facilitates relaxing the electric field in the alternating-conductivity-type layer in separation region 9. Therefore, the super-junction MOSFET according to the fourth embodiment is expected to further improve the breakdown voltage.

As described above, the super-junction MOSFET according to any of the first through fourth embodiments of the invention facilitates building therein a sensing device region for detecting an overcurrent without lowering the breakdown voltage and protecting the super-junction MOSFET from the overcurrent by connecting an overcurrent protecting circuit thereto.

Although the invention has been described in connection with the super-junction MOSFET's, the invention is applicable also to super-junction IGBT's. When the present invention is applied to super-junction IGBT's, the source and the drain in the above descriptions are replaced by an emitter and a collector. After polishing the back surface of a semiconductor substrate by the method well known to the persons skilled in the art, it is necessary to form a p-type collector layer on the polished back surface of the semiconductor substrate and to add an n-type field-stop layer, if necessary.

Thus, a super-junction semiconductor device has been described according to the present invention. Many modifications and variations may be made to the techniques and structures described and illustrated herein without departing from the spirit and scope of the invention. Accordingly, it should be understood that the devices and methods described herein are illustrative only and are not limiting upon the scope of the invention.

This application is based on and claims priority to Japanese Patent Application 2011-031836, filed on Feb. 17, 2011. The disclosure of the priority application in its entirety, including the drawings, claims, and the specification thereof, is incorporated herein by reference.

What is claimed is:

1. A superjunction-semiconductor device comprising:
   a semiconductor substrate layer of a first conductivity type;
   a drift layer comprising a first alternating-conductivity-type layer comprising a first semiconductor region of the first conductivity type and a second semiconductor region of a second conductivity type, the first and second semiconductor regions both being longer than they are wide in a direction perpendicular to a first major surface of the semiconductor layer of the first conductivity type, the first and second semiconductor regions being arranged alternately so that they adjoin each other in parallel to a first major surface of the semiconductor layer of the first conductivity type, so that they adjoin other in parallel to the first major surface of the semiconductor layer of the first conductivity type;
   a main device region and a sensing device region of which the drift layer is the first parallel pn layer, located on a first major surface side;
   the main device region comprising a main gate electrode and a main source electrode;
   the sensing device region comprising a sensing device cell comprising a sensing gate electrode and a sensing source electrode; and
   a separation region disposed between the drift layer of the main device region and the drift layer of the sensing region to separate the main device region and the sensing device region, the separation region comprising a third semiconductor region of the first conductivity type and a fourth semiconductor of the second conductivity type, the fourth semiconductor regions being arranged in the third semiconductor region in parallel and perpendicular to the first alternating conductivity-type layer, the fourth semiconductor region being separated from the second semiconductor region of the main device region and the second semiconductor region of the sensing device region and being in an electrically floating state
   wherein the separation region is disposed entirely between the main device region and the sensing device region, the breakdown withstanding section is provided in the peripheral region of the main device region, and the entire fourth semiconductor region is in a floating state.

2. The super-junction semiconductor device according to claim 1, wherein the first conductivity-type drain layer is formed on the second major surface of the first conductivity-type semiconductor layer, and a common drain electrode which is a drain electrode for each of the main device region and the temperature sensing region is formed on the upper surface of the drain layer.

3. The super-junction semiconductor device according to claim 2, wherein, in OFF-state, depletion layers respectively expand in the boundary between the second semiconductor region of the main device region and the third semiconductor region of the separation region and the boundary between the second semiconductor region of the sensing region and the third semiconductor region of the separation region.

4. The super-junction semiconductor device according to claim 3, wherein, in OFF-state, depletion layers expand to the entire of the first parallel pn layer and the second parallel pn layer.

5. The super-junction semiconductor device according to claim 3, wherein the separation region comprises a second alternating-conductivity-type layer, in which the fourth semiconductor regions are arranged in the third semiconductor region in a planer lattice pattern.

6. The super-junction semiconductor device according to claim 5, wherein the first alternating-conductivity-type layer in the main device region and the sensing device region comprises a planar stripe pattern.

7. The super-junction semiconductor device according to claim 3, wherein a repeating pitch of the second alternating-conductivity-type layer is less than a repeating pitch of the first alternating-conductivity type layer.

8. The super-junction semiconductor device according to claim 3, wherein the first alternating-conductivity-type layer in the main device region and the sensing device region comprises a planar stripe pattern, and wherein the separation region comprises a second alternating-conductivity-type layer, in which the fourth semiconductor regions are arranged in the third semiconductor region in a planer lattice pattern.

* * * * *